United States Patent [19]
Cory et al.

[11] Patent Number: 5,325,058
[45] Date of Patent: Jun. 28, 1994

[54] METHOD FOR IMPROVING SELECTIVITY IN NMR EXPERIMENTS INVOLVING COHERENCE TRANSFORMATION

[75] Inventors: David G. Cory, Boston; Frank H. Laukien, Lincoln; Werner E. Maas, Billerica, all of Mass.

[73] Assignee: Bruker Instruments, Inc., Billerica, Mass.

[21] Appl. No.: 30,511

[22] Filed: Mar. 12, 1993

[51] Int. Cl.$^5$ .............................................. G01V 3/00
[52] U.S. Cl. .................................................. 324/309
[58] Field of Search ............... 324/300, 306, 307, 309, 324/310, 311, 312, 313, 314, 318, 322; 128/653.2

[56] References Cited

PUBLICATIONS

Current Aspects of Practical Two-Dimensional (2D) Nuclear Magnetic Resonance (NMR) Spectroscopy: Applications to Structure Elucidation, Richard Kriwacki and T. Phil Pitner *Pharmaceutical Research*, vol. 6, No. 7 (1989), pp. 531–554 (no month).
Gradient-Enhanced Spectroscopy: A Tutorial, Boban John et al. (1992), internal Bruker Instruments document, pp. 1–56 (no month).
Two-Dimensional NMR Spectroscopy: Background and Overview of The Experiments, Horst Kessler, et al., *Angewandte Chemie, Int. English Edition*, vol. 27, No. 4 (Apr. 1988) pp. 490–536.

*Primary Examiner*—Michael J. Tokar
*Attorney, Agent, or Firm*—Cesari and McKenna

[57] ABSTRACT

Coherence transformation selectivity is improved by using combinations of homogeneous RF pulses and "radial" RF pulses that have a uniform RF field strength throughout the sample, but whose phase (relative to the detection coil phase) has a spatial dependence such that all possible phase differences are equally represented throughout the sample. The use of radial pulses allows the spin coherences in the sample to evolve in spatial waves and the observation, or suppression, of a given coherence can be selected by using a receiver coil which has a predetermined symmetry relative to the symmetry of the spatial wave.

18 Claims, 4 Drawing Sheets

METHOD FOR IMPROVING SELECTIVITY IN NMR EXPERIMENTS INVOLVING COHERENCE TRANSFORMATION

FIELD OF THE INVENTION

This invention relates to nuclear magnetic resonance (NMR) spectroscopy and, in particular, to NMR experiments involving coherence transformations.

BACKGROUND OF THE INVENTION

All atomic nuclei of elements with an odd atomic mass or an odd atomic number possess a nuclear magnetic moment. Nuclear magnetic resonance is a phenomenon exhibited by this select group of atomic nuclei (termed "NMR active" nuclei), and is based upon the interaction of the nucleus with an applied, external magnetic field. The magnetic properties of a nucleus are conveniently discussed in terms of two quantities: the gyromagnetic ratio ($\gamma$); and the nuclear spin (I). When an NMR active nucleus is placed in a magnetic field, its nuclear magnetic energy levels are split in to (2I+1) non-degenerate energy levels, which are separated from each other by an energy difference that is directly proportional to the strength of the applied magnetic field. This splitting is called the "Zeeman" splitting and the energy difference is equal to $\gamma h H_0 / 2\pi$, where h is Plank's constant and $H_0$ is the strength of the applied magnetic field. The frequency corresponding to the energy of the Zeeman splitting ($\omega_0 = \gamma H_0$) is called the "Larmor frequency" and is proportional to the field strength of the magnetic field. Typical NMR active nuclei include $^1H$ (protons), $^{13}C$, $^{19}F$, and $^{31}P$. For these four nuclei $I = \frac{1}{2}$, and each nucleus has two nuclear magnetic energy levels.

When a bulk sample of material containing NMR active nuclei is placed within a magnetic field called the main static field, the nuclear spins distribute themselves amongst the nuclear magnetic energy levels in accordance with Boltzmann's statistics. This results in a population imbalance among the energy levels and a net nuclear magnetization. It is this net nuclear magnetization that is studied by NMR techniques.

At equilibrium, the net nuclear magnetization of the aforementioned bulk sample is aligned parallel to the external magnetic field and is static (by convention, the direction of the main static field is taken to be the Z-axis). A second magnetic field perpendicular to the main static magnetic field and rotating at, or near, the Larmor frequency can be applied to induce a coherent motion of the net nuclear magnetization. Since, at conventional main static magnetic field strengths, the Larmor frequency is in the megahertz frequency range, this second magnetic field is called a "radio frequency" or RF field.

The effect of the RF field is to shift the nuclear magnetization direction so that it is no longer parallel to the main static field. This shift introduces a net coherent motion of the nuclear magnetization about the main static field direction called a "nutation". In order to conveniently deal with this nutation, a reference frame is used which rotates about the laboratory reference frame Z-axis at the Larmor frequency and also has its Z-axis parallel to the main static field direction. In this "rotating frame" the net nuclear magnetization, which is rotating in the stationary "laboratory" reference frame, is now static.

Consequently, the effect of the RF field is to rotate the now static nuclear magnetization direction at an angle with respect to the main static field direction (Z-axis). The new magnetization direction can be broken into a component which is parallel to the main field direction (Z-axis direction) and a component which lies in the plane transverse to the main magnetization (X-Y plane). The RF field is typically applied in pulses of varying length and amplitude and, by convention, an RF pulse of sufficient amplitude and length to rotate the nuclear magnetization in the rotating frame through an angle of 90°, or $\pi/2$ radians, and entirely into the X-Y plane is called a "$\pi/2$ pulse".

Because the net nuclear magnetization is rotating with respect to the laboratory frame, the component of the nuclear magnetization that is transverse to the main magnetic field or that lies in the X-Y plane rotates about the external magnetic field at the Larmor frequency. This rotation can be detected with a receiver coil that is resonant at the Larmor frequency. The receiver coil is generally located so that it senses voltage changes along one axis (for example, the X-axis) where the rotating magnetization component appears as an oscillating voltage. Frequently, the "transmitter coil" employed for applying the RF field to the sample and the "receiver coil" employed for detecting the magnetization are one and the same coil.

Although the main static field is applied to the overall material sample, the nuclear magnetic moment in each nucleus within the sample actually experiences an external magnetic field that is changed from the main static field value due to a screening from the surrounding electron cloud. This screening results in a slight shift in the Larmor frequency for that nucleus (called the "chemical shift" since the size and symmetry of the shielding effect is dependent on the chemical composition of the sample).

In a typical NMR experiment, the sample is placed in the main static field and a $\pi/2$ pulse is applied to shift the net magnetization into the transverse plane (called transverse magnetization). After application of the pulse, the transverse magnetization, or "coherence", begins to precess about the Z-axis, or evolve, due to the chemical shifts at a frequency which is proportional to the chemical shift field strength. In the rotating frame, the detector (which is stationary in the laboratory frame) appears to rotate at the Larmor frequency. Consequently, the detector senses an oscillation produced by an apparent magnetization rotation at a frequency which is proportional to the frequency difference between the Larmor frequency and the chemical shift frequency.

Thus, the detected signal oscillates at the frequency shift difference. In addition to precessing at the Larmor frequency, in the absence of the applied RF field energy, the nuclear magnetization also undergoes two spontaneous processes: (1) the precessions of various individual nuclear spins which generate the net nuclear magnetization become dephased with respect to each other so that the magnetization within the transverse plane loses phase coherence (so-called "spin-spin relaxation") with an associated relaxation time, $T_2$, and (2) the individual nuclear spins return to their equilibrium population of the nuclear magnetic energy levels (so-called "spin-lattice relaxation") with an associated relaxation time, $T_1$. The latter process causes the received signal to decay to zero. The decaying, oscillating signal is called a free induction decay (FID).

In a typical NMR experiment, the FID is repeatedly sampled at discrete time intervals and the corresponding amplitude digitized. The resulting digital samples are generally subjected to a Fourier transformation which produces a frequency spectrum having peaks at the chemical shift frequencies. This type of NMR experiment is called a one-dimensional NMR experiment.

It is often useful to exploit the coupling of one nucleus to another to explore spin coherences between nuclei. One extremely powerful application of such coherence transformations is found in multi-dimensional experiments. In such experiments, the spins are excited and spin evolution proceeds for an evolution time. The spins are then driven through a coherence transformation by a mixing pulse and, finally, the evolution is detected. A two-dimensional Fourier tansformation then yields a correlation of the spin states prior to, and following, the mixing pulse.

An important strength of modern NMR spectroscopy is the ability to drive the dynamics of the spin system through a series of coherence transformations such that the resultant observable magnetization reflects desired combinations of evolutions and interactions. Coherence transformations can be used not only for transferring magnetization from one spin to another (such as described in detail below), but also for "filtering" purposes to select only those spin systems with a given property (such as in multiple-quantum filters).

For example, coherence transformations can be used in a two-dimensional (2D) NMR experiment to display correlations between coupled spins. A typical 2D experiment involves the interaction of each $^1H$ nucleus (proton) with all of its coupling partners. In the experiment, the protons are excited during a "preparation" time period by an application of a $\pi/2$ RF pulse at the proton resonant frequency. The resulting coherence evolves under influence of the chemical shift during an "evolution" time period. The coherence is transferred between coupled protons during a "mixing" period by applying a second RF pulse to the protons (this process is sometimes called "polarization transfer"). Finally, during a detection period, the FID is sampled and collected.

The resulting FID signal is modulated not only by the chemical shift evolution of the protons during the detection period but also by the evolution period spin evolution of coupled protons. Since, the resulting signal depends on the correlation of two nuclei, the process is often called COrrelation SpectroscopY (COSY).

The resulting FID signal is processed in a manner similar to the one-dimensional experiment by taking the Fourier transformation of the signal. However, a second time dimension is introduced by repeating the experiment while systematically varying the length of the evolution time period. The resulting set of FIDs are then subject to a second Fourier transformation over the varying time of the evolution period. The two frequency spectra can be plotted along the horizontal and vertical coordinates of a graph to produce a two-dimensional plot. This plot has "peaks" which represent coherence transformations and, therefore, is useful in studying molecular structure.

As described in the 2D NMR example above, coherence transformations are most often accomplished via RF pulses. The fine selectivity desired is rarely achieved by a single sequence of RF pulses and is most often built up over a series of separate experiments, each of which uses a sequence of RF pulses. The phases of selected RF pulses in each sequence are often modulated, or cycled, from experiment to experiment while all other variables are kept constant. In these latter experiments, the phase of the observation (the receiver phase) is also modulated along with the pulse phase. The results of several experiments are then averaged to generate an overall result. In this manner, selected magnetization that is modulated in the same way as the receiver phase is modulated is retained in the overall result while other unwanted magnetization is eventually averaged to zero.

For example, in the 2D NMR example discussed above, the selectivity produced by the mixing pulses is degraded by several problems. One problem is so-called "axial" peaks that are generated by magnetization which did not evolve under influence of the proton chemical shift during the evolution period (such as magnetization excited by the mixing pulse). Another problem is that the resulting 2D spectrum appears as a mirror image of itself (the two sets of peaks are called n-type" peaks and "p-type" peaks) since the experiment cannot distinguish the sense (right or left) of the magnetization rotation during the evolution period. Other problems include instrument artifacts and noise. The axial pulses, mirrored peaks, artifacts and noise can obscure signal data in complicated spectra and make interpretation of the data difficult.

These problems are generally dealt with by phase cycling the mixing pulse in the COSY sequence. By properly phase cycling the mixing pulse and adding the results of several experiments, the axial pulses and some artifacts can be eliminated and one set of pulses (the n-type or the p-type) can be selected.

Phase cycling is a widely used and very powerful concept, but, in some cases, phase cycling leads to an inefficient use of spectrometer time because multiple experiments must be run. In addition, phase cycling is susceptible to additional artifacts arising from spectrometer instabilities and from non-steady state conditions which changes the starting magnetization between experiments.

Consequently, the prior art has sought a method for improving the selectivity of coherence transformations without requiring that the results of multiple experiments be averaged. One prior art method is a single FID acquisition alternative to phase cycling that uses magnetic gradient pulses to improve selectivity. These gradient pulses superimpose a spatially dependent magnetic field on the main static field ($B_0$) and suppress unwanted coherence transformations. For example, in the 2D COSY experiment described above, gradient pulses can be applied both before and after the mixing pulse to suppress axial pulses and select either n-type or p-type peaks.

Another prior art approach is to use RF ($B_1$) magnetic gradients superimposed on the RF pulses (which are normally homogeneous over the sample) to improve selectivity. This latter technique has been investigated, but not widely used.

Accordingly, it is an object of the present invention to improve the selectivity of coherence transformations without incurring the time and accuracy penalties of the phase cycling method.

SUMMARY OF THE INVENTION

The foregoing problems are overcome and the foregoing object is achieved in an illustrative embodiment of the invention in which coherence transformation selectivity is improved by using combinations of homogeneous RF pulses and "radial" RF pulses. As used herein, a "radial" RF pulse is a pulse that has a uniform RF field strength throughout the sample, but whose phase (relative to the detection coil phase) has a spatial dependence such that all possible phase difference are equally represented throughout the sample.

The use of radial pulses allows the spin coherences in the sample to evolve in spatial waves and the observation, or suppression, of a given coherence can be selected by using a receiver coil which has a predetermined symmetry relative to the symmetry of the spatial wave.

DETAILED DESCRIPTION OF THE PREFERRED EMBODIMENTS

As previously mentioned, a radial pulse has an RF field with a uniform RF field strength throughout the sample, but a phase (relative to the detection coil phase) with a spatial dependence such that all possible phase differences are equally represented throughout the sample. The homogeneous pulse has a field with a uniform field strength and a phase which is constant over the sample. For convenience in discussing the symmetry of the two fields, both fields can be normalized to the phase of the homogeneous field which is defined as having a spatial RF field profile of the form:

$$B_H(r,t) = 2B_1 \cos(\omega_{rf} t)\{\cos(\theta) e_x^L + \sin(\theta) e_y^L\} \quad (1)$$

where $\hat{e}_x^L$ and $\hat{e}_y^L$ define the directions of the laboratory frame, $\theta$ is the phase of the RF field (generated in the transmitter) and it is assumed that, at an instant in time, the field is spatially uniform throughout the transverse plane. For an "x" pulse, $\theta$ is equal to zero. The corresponding rotating frame Hamiltonian is:

$$H_H(t) = -B_{1y}\{\cos(\omega_{rf} t + \theta) I_x + \sin(\omega_{rf} t + \theta) I_y\} \quad (2)$$

which is spatially uniform. The spatial distribution of the homogeneous RF field in the transverse plane is shown schematically in FIG. 1A where each of the horizontal arrows represents the local field strength.

Figure 1B:
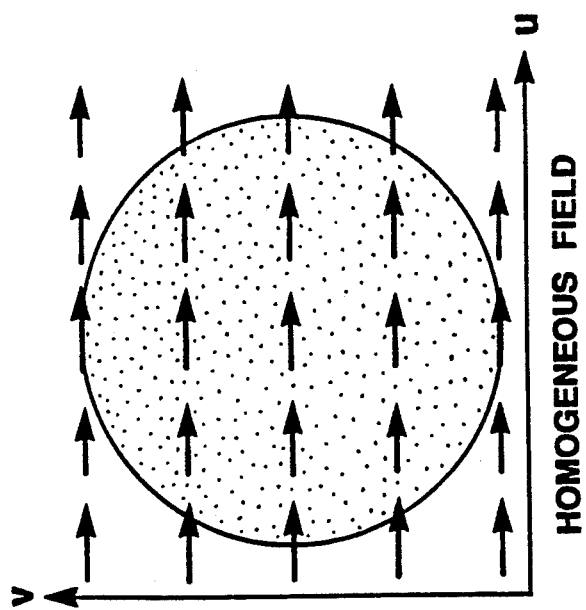
FIG. 1B is a schematic illustration of a field distribution in a radial RF coil. The shaded area corresponds to the sample volume which is restricted to an annular region so that the RF field strength is uniform throughout the sample.
Figure 1A:
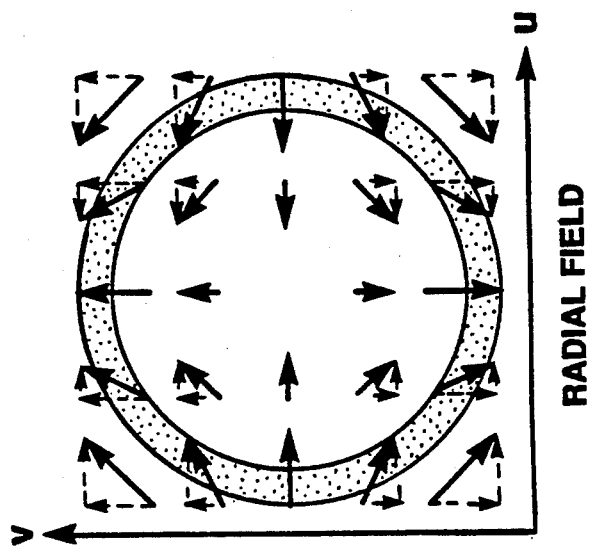
FIG. 1A is a schematic illustration of a field distribution in a homogeneous RF coil. The shaded area corresponds to the sample volume.

In contrast, the radial configuration has an RF field profile of the form:

$$B_R(r,t) = 2B_1 \cos(\omega_{rf} t)\{\cos(\phi(r) + \theta) e_x^L + \sin(\phi(r) + \theta) e_y^L\} \quad (3)$$

where $\phi(\bar{r})$ is a phase dependence of the RF field as a function of location, $\theta$ is the transmitter phase and the desired symmetry is cylindrical at least within an annular sample. Therefore, the spatial variation is only an angular variation in phase:

$$\phi(r) = \phi(\Psi) = \Psi + \psi \quad (4)$$

where $\Psi$ is the angle in the laboratory frame that identifies the spin of interest, and $\psi$ is a phase offset. The RF field is a function of the angular position of the spin within the sample, and the phase angle of the RF field at this position is a linear function of this angle in the laboratory frame. A schematic representation of an illustrative radial RF field in the transverse plane is shown in FIG. 1B, where the field strength is uniform within the annular sample indicated by the shaded ring. Since an annular sample will be assumed for the following discussion, the variation of the RF field strength with radius shown in FIG. 1B will be neglected for the discussion below. In addition, other coil geometries and configuration can be used to generate the field.

The RF field shown in FIG. 1B can be generated by a probe with a coil that simultaneously generates two gradient fields that are orthogonal to each other. With proper spatial amplitude variation, the two fields will be superimposed to form the radial field as shown schematically in FIG. 1B. A probe with coils that are capable of generating such a field is disclosed in more detail in our copending application entitled "An Improved NMR Probe Which Includes $B_1$ Gradient Coils", filed on an even date herewith and assigned to the same assignee as the present invention.

Such a probe is capable of generating two RF magnetic fields with different symmetries: homogeneous and radial. However, both RF fields are derived from the same transmitter, and so the two RF fields are coherent (although not in phase). The probe can be actively switched between generation of these two field configurations. The switching time between these two field configurations should be typically shorter than 10 $\mu s$, and the probe is designed to be switched to either state at any time during an experiment. For example, any RF pulse in an experimental sequence may be applied as either a homogeneous or a radial pulse, and the detection may be carried out with the receiver coil configured in either the homogeneous or radial configuration.

As described by the principles of reciprocality, the spatial variation of the efficiency of an RF coil is given by the field it produces:

$$\zeta = \int_\Omega \frac{\vec{B}(r) \cdot \vec{\mu}(r)}{|\vec{B}(r)|} dr \quad (4)$$

The above equation expresses the instantaneous, normalized voltage across the RF coil in terms of the RF field strength, $\vec{B}(r)$, of the detection coil, and the spin magnetization, $\vec{\mu}(r)$. The integral covers the sample volume. It is important to note that it is the integrated overlap of these two fields that results in a signal. In accordance with the principles of the invention, the overlap of the fields has important consequences when RF fields with different symmetries are used in an experiment.

More particularly, assuming a spatially uniform spin system at equilibrium, a single $\pi/2$ pulse will create a pattern of spin magnetization within the transverse plane that has the same symmetry as the RF field profile of the pulse. Neglecting the details of the spatial extent of the sample, the equilibrium density matrix is spatially independent:

$$\rho_0 = I_z \quad (5)$$

and remains so following a homogeneous $\pi/2$ pulse:

$$\rho = -I_y \quad (6)$$

The signal as a function of time detected via the homogeneous RF coil is:

$$\zeta = \int_\Omega e_x^L \cdot \{-M_0(\cos(\omega t)e_y^L + M_0(\sin(\omega t)e_x^L\}dr \text{ or} \quad (7)$$

$$\zeta = M_0 \sin(\omega t) \quad (8)$$

If a homogeneous coil is used for both excitation and detection, then the coupling of the spin magnetization to the coil is spatially independent.

However, if the radial coil is used for detection following a homogeneous RF excitation pulse, then the signal detected as a function of time by the radial coil is:

$$\zeta = \int_\Omega \{\cos\phi(r)e_x^L + \sin\phi(r)e_y^L\} \cdot \quad (9)$$
$$M_0\{-\cos(\omega t)e_y^L + \sin(\omega t)e_x^L\}dr$$

The integral is most readily evaluated in polar coordinates, since the sample is confined to an annular area. It is only the angular variation in the fields that contribute and hence the value of the integral is zero and no signal is detected via the radial RF coil. In summary, a $\pi/2$ pulse on the homogeneous RF coil will create a spatially uniform spin magnetization throughout the sample. This pattern of magnetization will generate an observable signal within this same coil. However, since the field from the radial coil varies in phase symmetrically over $2\pi$ with respect to the field created by the homogeneous coil, this same magnetization is not detectable with the radial coil. The reciprocal is also true. Following a $\pi/2$ pulse on the radial coil, the density matrix has the dependence:

$$\rho = -\sin(\Psi + \psi)I_x - \cos(\Psi + \psi)I_y \quad (10)$$

and the signal detected via the radial coil is:

$$\zeta = \int_0^{2\pi} \{\cos(\Psi + \psi)e_x^L + \sin(\Psi + \psi)e_y^L\} \cdot \quad (11)$$
$$M_0\{\cos(\Psi + \psi)[\cos(\omega t)e_x^L + \sin(\omega t)e_y^L] +$$
$$\sin(\Psi + \psi)[\cos(\omega t)e_y^L - \sin(\omega t)e_x^L]\}d\Psi$$

The integral evaluates to $M_0 \sin(\omega t)$ which is spatially independent, however, a homogeneous coil has the wrong symmetry to detect such a signal. Thus, in accordance with the invention, RF pulses can be applied to a sample using one type of coil (either homogeneous or radial). The pulses will manipulate the spin dynamics, but will not excite any detectable magnetization that is detectable by the other type of coil.

From the above discussion, it is evident that the efficiency of the coil is dependent on the field strength that is created in the coil (for a given power) and does not explicitly depend on the RF field phase distribution. Geometric considerations governing coil efficiency affect the field strength and are neglected here. From a practical point of view, for similarly-sized coils and a thin, annular sample that fills the coil, the efficiencies of the homogeneous and radial coils are comparable as measured by the nutation frequency. Clearly, however, at the center of a cylindrical sample, the efficiency of a radial coil is zero.

As an illustration of the principles of the invention, a single acquisition P or N type quadrature-detected COSY experiment is discussed in detail below, however, the invention is not limited to this particular application, but is generally applicable to any coherence transfer experiment. A comparison of COSY experiments using phase-cycled, $B_0$, pulses, gradient pulses and radial pulses is shown in FIGS. 2A-2F.

As previously mentioned, a COSY experiment maps out spin-spin connectivities based on scalar couplings, and in accordance with the well-known product operator formalism corresponds to the transformations:

$$I_z \xrightarrow{(\pi/2)_x} I_y \xrightarrow{t_1} I_x I_{z'} \xrightarrow{(\pi/2)_y} I_z I_{z'} \xrightarrow{t_2} I_{y'} \quad (12)$$

which indicates that coherences on one spin are transferred to observable magnetization on a coupled spin.

As previously-mentioned, the goals of phase cycling the $B_1$ pulses are to:

(1) suppress axial resonances (resonances that arise from relaxation during the phase encoding time and are, therefore, not modulated in $t_1$);

(2) allow quadrature detection in the first frequency domain; and (3) avoid artifacts from receiver imperfections.

In the discussion below, the avoidance of receiver artifacts is neglected to simplify the discussion. The COSY experiment normally consists of two RF $\pi/2$ pulses, the first of which creates transverse magnetization that is then allowed to evolve into antiphase two-spin coherences. The second, or mixing, RF $\pi/2$ pulse switches the two-spin antiphase coherence from being antiphase in one spin to being antiphase in the other spin. During the detection period, this latter antiphase coherence then evolves into detectable transverse magnetization for the second spin. To avoid axial peaks, the second RF pulse should not excite any new magnetization; that is, all detected magnetization should be modulated in $t_1$.

During the phase encoding interval, $t_1$, the spin dynamics of the first spin correspond to rotations from chemical shifts and scalar couplings. However, the mixing pulse does not preserve the rotational character of the dynamics but instead selects one of the two quadrature components of the resulting magnetization so that only an oscillatory modulation of the signal is observed. This results in the sense of precession during $t_1$ being lost, and the subsequent complex Fourier transformation yields both p and n type resonances since the oscillatory signal is decomposed into rotating, and counter-rotating, signals.

Consequently, phase cycling of the mixing pulses is used so that both quadrature components are sampled over the course of several experiments in order to return the full rotational character to the spin dynamics. P- and n-type resonances are distinguished by the rotational sense of precession in $t_1$ compared to the rotational sense during $t_2$, n being negative and p being positive. The effective sense of precession during the $t_1$ time interval depends on the relative sign of the two quadrature components. Therefore, subtracting the quadrature components obtained over the course of the successive experiments yields n-type resonances and addition of the quadrature components yields p-type resonances.

Axial resonances are also removed by phase cycling. The phase of the axial resonance follows the phase of the mixing pulse, so inverting the mixing pulse and adding the result cancels any axial signals.

Figure 2A:
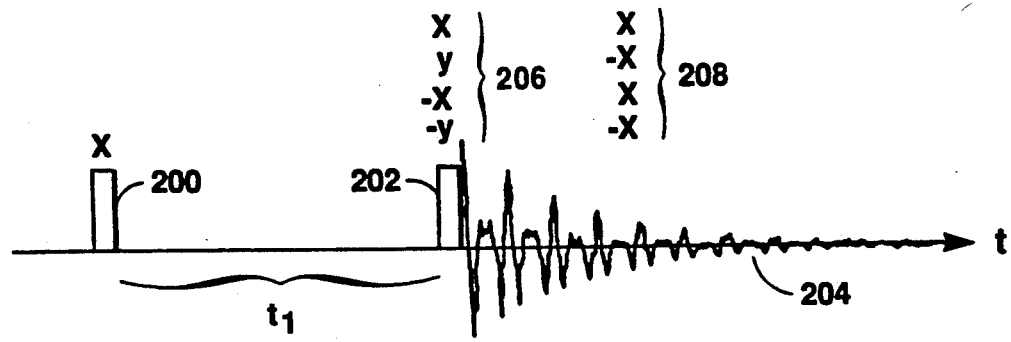
FIG. 2A is a schematic illustration of a conventional quadrature-detected COSY experiment in which n-type resonances are selected using phase-cycling of the mixing pulses.
Figure 2B:
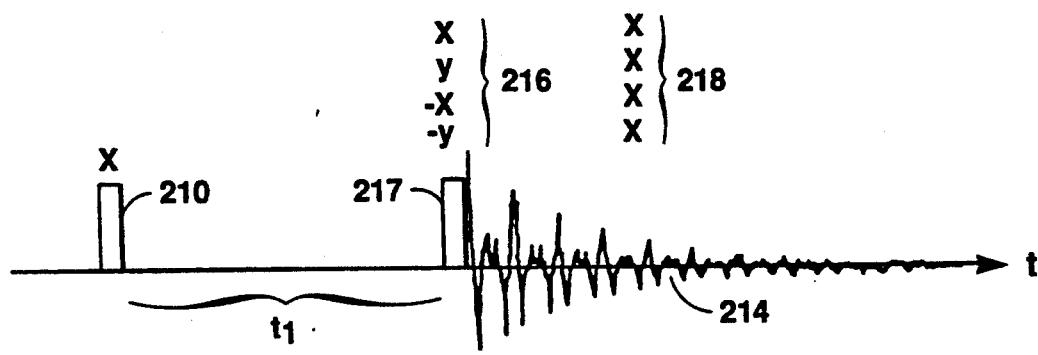
FIG. 2B is a schematic illustration of a conventional quadrature-detected COSY experiment in which p-type resonances are selected using phase-cycling of the mixing pulses.

FIGS. 2A and 2B schematically indicate a conventional 2-dimensional COSY experiment performed using phase-cycling of the mixing pulse. The horizontal line in the figures represents time increasing to the right. The vertical scale represents the magnitude or amplitude of the respective signal.

In FIG. 2A, a $\pi/2$ RF excitation pulse 200 is applied at the start of the evolution period at the resonance frequency of the first spin system. As indicated by the "x" over the pulse, the pulse is applied in the transverse plane along the X-axis. The excited spins evolve during the evolution time period $t_1$ and mixing pulses schematically represented by pulse 202 are applied at the resonant frequencies of both spin systems to transfer the coherences of the first spin system to the second spin system. Finally, an FID 204 is acquired at the resonant frequency of the second spin system during the detection period. As illustrated in FIG. 2A, the mixing pulses 202 are phase-cycled as set forth in the list of phases (206) above pulse 202. A list of phases of the receiver coil corresponding to the mixing pulse phases is shown in list 208 over FID 204. These phases illustrate phase changes for the mixing pulse and receiver coil for four successive signal acquisitions. During each acquisition, the phase of the mixing pulse remains constant, but the phase is changed between acquisitions. With the sequences shown (x, y, −x, −y where "y" indicates a pulse applied along the Y-axis and a -x pulse is 180° out of phase with an x pulse) the n-type resonances are selected.

In FIG. 2B, a $\pi/2$ RF excitation pulse 210 is applied at the start of the evolution period $t_1$ at the resonance frequency of the first spin system along the X-axis. The mixing pulses (schematically illustrated by pulse 212) are phase cycled in the sequence 216 (with the corresponding receiver phases in list 218) to select the p-type resonances.

Figure 2C:
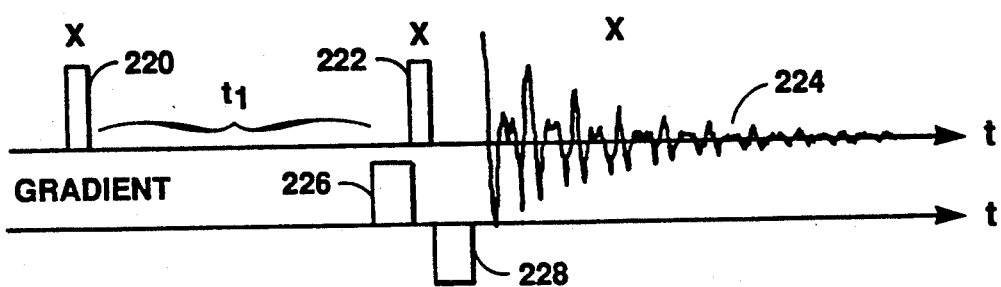
FIG. 2C is a schematic illustration of a conventional quadrature-detected COSY experiment in which p-type resonances are selected using $B_0$ gradient pulses.
Figure 2D:
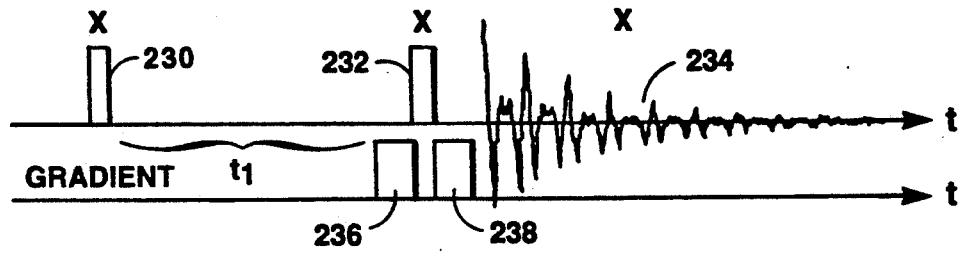
FIG. 2D is a schematic illustration of a conventional quadrature-detected COSY experiment in which n-type resonances are selected using $B_0$ gradient pulses.

A conventional $B_0$ gradient experiment is shown schematically in FIGS. 2C and 2D. This experiment generates the same data as the phase-cycled experiment in a single acquisition by phase modulating the spin dynamics prior to the mixing pulse rather than by directly modulating the phase of the mixing pulse. As shown in FIG. 2C, the spin system is excited by an excitation pulse 220 applied in the x-direction. Mixing pulses as illustrated by pulse 222 are also applied in the x-direction.

However, as illustrated in the lower line of the figure, a gradient pulse 226 is applied to the sample prior to the mixing pulse 222 which gradient pulse introduces a spatially dependent phase shift across the sample. The gradient generates a periodic magnetization in the sample which can be thought of as sort of a "grating" with a period of which is:

$$\text{period} = \left( \gamma \frac{\partial B_z}{\partial z} t_g \right)^{-1} \tag{13}$$

where $t_g$ is the length of the gradient pulse, and so the phase offset due to the gradient at a given position within the sample is:

$$\theta(z) = 2\pi\gamma \frac{\partial B_z}{\partial z} z t_g \tag{14}$$

For example, a 1 ms, 20 G/cm gradient pulse has a period of 0.115 mm, or across a 5 mm sample there are just over 40 wavelengths. This fine magnetization grating can be thought of as introducing a phase shift into the mixing pulse where the phase shift varies over $2\pi$ over each period of the magnetization grating.

If the grating is sufficiently fine that end effects can be neglected, then the experiment is essentially equivalent to applying a mixing pulse that effectively has all phases at once. Such a pulse will clearly preserve the rotational character of the spin dynamics during the phase encoding time. An additional inverted gradient pulse, 228, following the mixing pulse, 220, and before the FID, 224, is acquired is necessary to "unwind" the spatial phase shift that was introduced by the first gradient pulse, 226, since the receiver coil has a spatially constant phase.

From the above reasoning, it is clear that the combination gradient pulse-RF pulse-inverted gradient pulse will select p-type resonances; this combination is a type of "composite" pulse that is discussed in detail below. However, by changing the sign of the second gradient pulse (228) it is possible to select n-type resonances. Such a sequence is shown in FIG. 2D, where the second gradient pulse 238 is not inverted. This result can be reached through calculations, but can be seen intuitively as well. Specifically, the first gradient pulse 236 creates a magnetization grating in the sample as described above. The RF mixing pulse 232 places half of the single quantum magnetization along the z-axis where it will not contribute to the observed magnetization. Therefore, just as in the phase-cycled COSY experiment, the mixing pulse 232 is not able to preserve the rotational character of the spin dynamics which evolved during the $t_1$ time interval. Consequently, after the mixing pulse 232 is applied, the magnetization grating across the sample appears to be generated from an oscillation rather than a rotation. The difference between an oscillation and a rotation is that it is the sign of the gradient dynamics that has been lost and the spatial variation in spin magnetization is proportional to:

$$[\sin(\omega t_1 + \theta_g(z)) \pm \sin(\omega t_1 - \theta_g(z))]/2 \quad (15)$$

where $\omega$ is the resonance frequency of the spin of interest, and the sign depends on which of the two quadrature components is observed. Varying the sign of the second gradient pulse will invert the sign of one of the quadrature components and switch from one diagonal to the other. The sense of rotation for the cross peaks follows exactly the same arguments.

The $B_0$ gradient experiment also suppresses axial resonances as can be clearly seen because any coherences created by the second RF pulse (222 or 232) are dephased by the second gradient pulse (228 or 238) since the coherences never experienced the first gradient pulse (226 or 236).

Figure 2E:
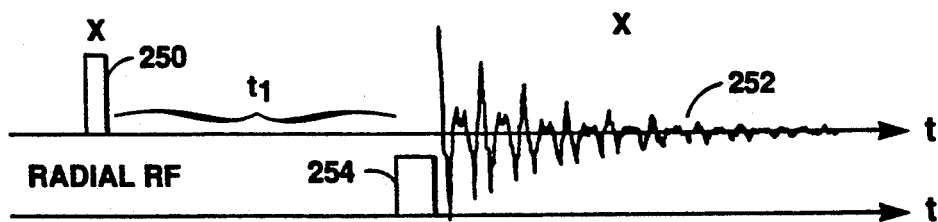
FIG. 2E is a schematic illustration of a quadrature-detected COSY experiment conducted in accordance with the principles of the invention in which p-type resonances are selected using radial pulses.
Figure 2F:
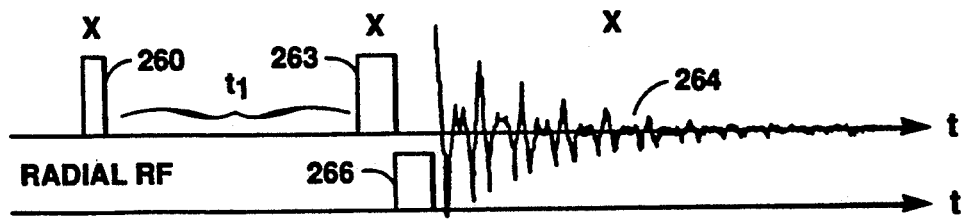
FIG. 2F is a schematic illustration of a quadrature-detected COSY experiment conducted in accordance with the principles of the invention in which n-type resonances are selected using radial pulses.

In accordance with the principles of the invention, an experiment using radial RF pulses is diagrammed in FIGS. 2E and 2F. This experiment can be used to select either the n-type resonances or the p-type resonances in a single acquisition. The radial pulse experiment can be thought of as producing similar results to the $B_0$ experiment discussed above. In particular, gradient and RF pulse sequence in the $B_0$ experiment which is the combination:

$$\text{gradient} - \left(\frac{\pi}{2}\right)_x - \text{gradient} \quad (16)$$

can be considered a composite pulse of the type:

$$\left(\frac{\pi}{2}\right)_{2\pi\gamma \frac{\partial B_z}{\partial z} zt} \quad (17)$$

The inventive experiment applies a pulse of this type directly with a radial pulse, since the radial pulse has the property:

$$\left(\frac{\pi}{2}\right)_{\Psi + \psi} \quad (18)$$

where $\Psi$ is the angle in the laboratory frame described above.

The radial pulse COSY experiment creates cylindrical waves of spin coherences within the sample and the symmetry of the cylindrical waves depends on the coherence transformation. More particularly, it is only those waves that have a spatial dependency of sine-squared of the angle in the laboratory frame or cosine-squared of the same angle that will contribute to the signal. The coherence transformation that proceeds in the same direction as the evolution is retained, while that which is counter-rotating is suppressed. This suppression is the same mechanism that results from phase cycling, and results from the application of the gradient pulses in the $B_0$ case where a rotating signal is sampled such that only an oscillating signal is preserved and this is decomposed into a rotating and counter-rotating signal.

FIG. 2E schematically illustrates a radial pulse experiment in accordance with the principles of the invention. An excitation pulse 250 is generated on the homogenous channel (indicated by the upper line) and applied along the X-axis to excite the first spin system. After the evolution period $t_1$, a radial pulse 254 is applied on the radial channel (indicated by the lower line) along the X-axis. This radial pulse takes the place of the mixing pulse on the homogeneous channel and both transfers the coherences from the first spin system to the second spin system and selects the p-type resonances. After the radial pulse 254 is applied an FID 252 is acquired on the homogeneous channel along the X-axis.

The above discussion implies that to observe n-type resonances rather than p-type resonances, the direction of the phase increase of the radial pulse should be inverted (i.e. in the laboratory frame the phase should increase clockwise rather than counterclockwise). Physically, the instantaneous phase of the field generated by a coil will always increase in only one direction which direction cannot be varied during the experiment. However, a $\pi$ pulse applied on the homogeneous channel inverts the sense of phase evolution prior to the $\pi$ pulse and accomplishes the same thing.

An alternative experiment conducted in accordance with the principles of the invention is shown schematically in FIG. 2F. This latter experiment selects the n-type resonances. An excitation pulse 260 is generated on the homogenous channel (indicated by the upper line) and applied along the X-axis to excite the first spin system. After the evolution period $t_1$, a $\pi$ pulse 262 is applied on the homogeneous channel to invert the sense of the phase evolution. A radial pulse 266 is then applied on the radial channel (indicated by the lower line) along the X-axis. After the radial pulse 266 is applied an FID 254 is acquired on the homogeneous channel along the X-axis.

There is an important difference between the $B_0$ gradient experiment and the radial pulse experiment that shows up in the type of magnetization grating that is created within the sample and in the type of averaging that is performed to reveal the desired signal. The $B_0$ experiment generates a fine planar grating throughout the sample and the goal is to pack a sufficient number of wavelengths into the sample volume so that end effects are not important—hence, the stronger the gradient, the easier the experiment becomes (neglecting technical issues that limit the gradient strength).

The radial pulse experiment has only a single period of phase evolution throughout the sample, and relies on the symmetry of the two RF fields for cancellation. This means that the radial pulse can achieve the desired result with a single $\pi/2$ pulse and that the experiment can be easily designed in accordance with conventional principles for maximum coherence transfer.

Figure 3:
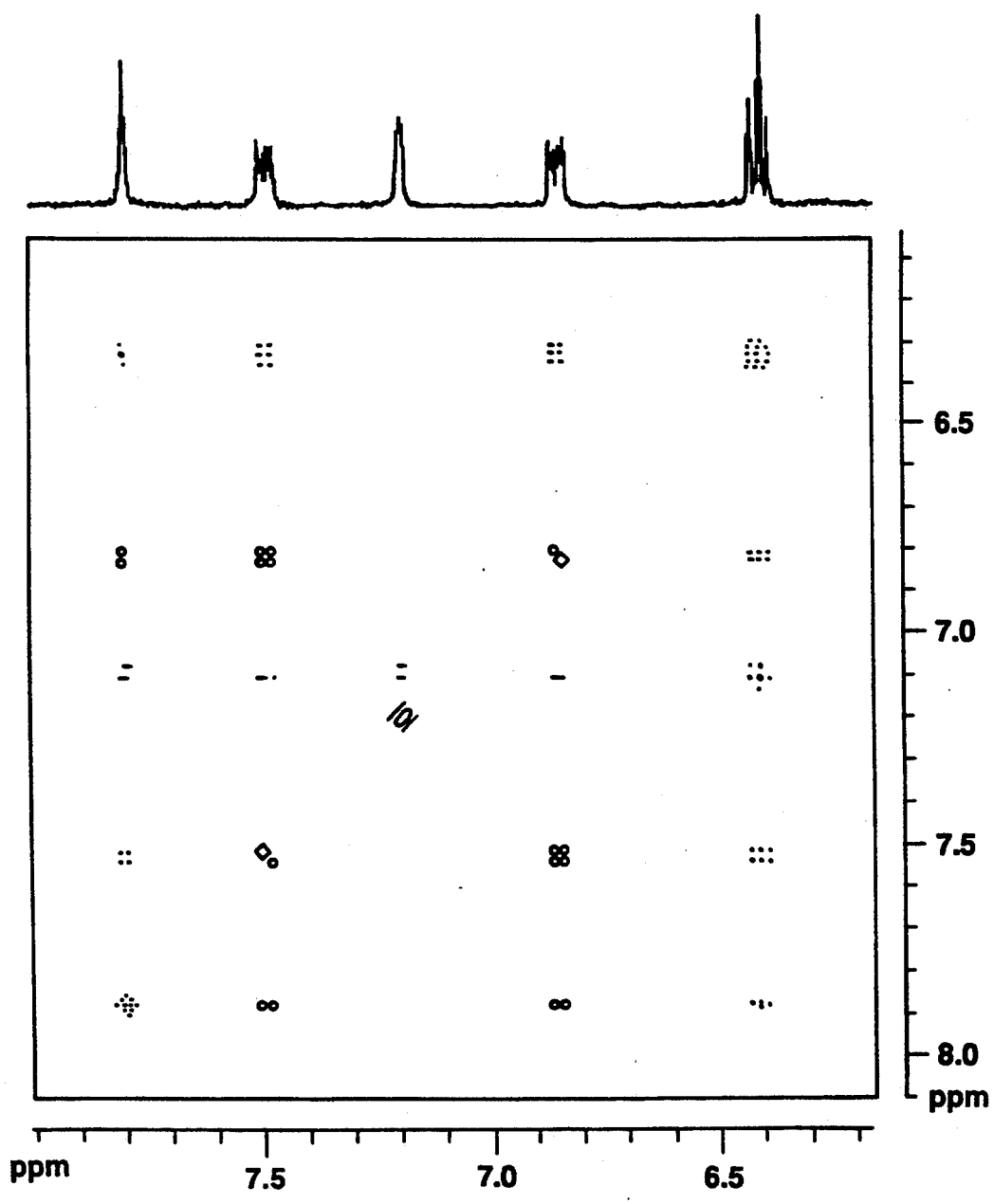
FIG. 3 is a two-dimensional plot of the results of a quadrature-detected COSY experiment conducted in accordance with the schematic illustration shown in FIG. 2F on a sample of 1 chloro, 3-nitro benzene in deuterated benzene.

FIG. 3 shows the results from a single acquisition COSY experiment performed using the n-type radial pulse sequence illustrated in FIG. 2F for a sample of 1-chloro, 3-nitro benzene in deuterated benzene. The experiment was performed with a prototype probe (constructed as described in the aforementioned patent application) on a Bruker model AMX-400 widebore NMR spectrometer, sold by Bruker Instruments, Inc. 19 Fortune Drive, Manning Park, Billerica, Mass. 01821. All of the expected resonances are observed and the p-type resonances are efficiently suppressed.

Some advantages that are inherent in this approach to NMR are that:

(1) by employing a combination of homogeneous and radial RF pulses, various portions of the sample will have different spin dynamics, the superposition of which can lead to desirable results;
(2) some artifacts are suppressed by symmetry;
(3) a fine magnetization grating does not need to be generated in the spin system; and
(4) spin evolution during the phase pulse can be neglected.

Examples of the first two of these points have been shown and apply equally to comparisons with phase-cycling and with $B_0$ gradient experiments. The last two points are directed to comparisons with $B_0$ experiments.

As was pointed out earlier, $B_0$ experiments rely on a fine magnetization grating being generated in the sample, so any motion that leads to displacements of the spins between the two gradient pulses will result in signal attenuation. Such motion includes diffusion, convection, and mechanical displacements (such as vibrations from pulsing the gradients in a magnetic field). Diffusion effects are not important until gratings as fine as 10 µm are used, and signal losses from the other mechanisms can be avoided by carefully designing the instrumentation and correctly tuning it. However, with a radial pulse experiment, the difficulties are completely avoided, the grating is not fine, it does not need to be refocussed, and the pulses are short.

Another recurring difficulty with $B_0$ gradients is that generally a gradient pulse must be applied during the time interval between the final RF mixing pulse and the observation of the FID. This means that the observation is delayed for the length of the gradient pulse (on the order of one millisecond or more) and a large phase warp is introduced into the detected signal. This problem is avoided by radial pulses since the radial pulses are short (10 to 20 µs) and no appreciable spin evolution occurs during this time.

Compared to $B_0$ experiments, the radial pulse experiments share many of the advantages that $B_1$ gradients have including:
(1) short switching times;
(2) no influence on the lock channel;
(3) no need for preemphasis of $z_0$ corrections;
(4) no distortions of the lineshape;
(5) no eddy currents; and
(6) the sample may be spun.

The first five points are a direct consequence of using an RF field to modify the spin system and, hence, the main magnetic field is not influenced. The idea of spinning a sample during an experiment that has a built-in spatial dependency is new, but since the radial pulses are very short compared to the rotation time of the sample, and because the absolute phase difference between the homogeneous field and the radial field at any position is not important in this experiment, there should be no problems.

In experiments where two or more radial pulses are applied, physically rotating the sample corresponds to a phase shift of the radial RF. Likewise, sample spinning during detection with a radial RF coil leads to the resonances being offset from their correct resonance frequency by the spinning frequency.

Although only one illustrative embodiment has been described in detail, the principles of the invention will immediately suggests other applications. For example, the principles of the invention are applicable in a manner which will be apparent to those skilled in the art to applications including, but not limited to multiple-quantum filters, and resonance suppression. In addition, the same results can be achieved by exciting the nuclear spins with a radial magnetic pulse, subsequently applying a homogeneous mixing pulse and detecting the NMR signal with a radial coil which may be the coil used to excite the spins.

In addition, for NMR experiments involving many coherence transformations, the inventive method may be applied to some of all of the coherence transformations.

What is claimed is:

1. A method for improving selectivity of NMR experiments involving NMR-active nuclei in a sample and at least one coherence transformation, the method comprising the steps of:
   A. exciting the NMR-active nuclei with a homogeneous RF pulse to generate a spin coherence; and
   B. applying an RF magnetic field pulse to the excited NMR nuclei to cause the coherence transformation, the RF magnetic field pulse comprising a magnetic field having a uniform RF field strength throughout the sample, but a phase which has a spatial dependence such that all possible phases are equally represented throughout the sample.

2. A method according to claim 1 wherein step A comprises the step of:
   A1. applying a $\pi/2$ RF pulse to the NMR-active nuclei.

3. A method according to claim 1 further comprising the steps of:
   C. detecting an NMR signal generated by the NMR-active nuclei with a receiver coil that has a homogeneous RF phase.

4. A method according to claim 3 wherein the RF magnetic field pulse applied to the excited NMR nuclei in step B comprises a magnetic field having a phase which has a spatial dependence relative to the receiver coil phase such that all possible phase differences are equally represented throughout the sample.

5. A method according to claim 3 wherein step B comprises the step of:
   B1. using an RF coil to generate the magnetic field gradient pulse and step C comprises the step of:
   C1. detecting the NMR signal with the RF coil used in step B1.

6. A method for improving selectivity of NMR experiments involving NMR-active nuclei in a sample and at least one coherence transformation, the method comprising the steps of:
   A. exciting the NMR-active nuclei to generate a spin coherence with an RF magnetic field pulse comprising a magnetic field having a uniform RF field strength throughout the sample, but a phase which has a spatial dependence such that all possible phases are equally represented throughout the sample; and
   B. applying a homogeneous RF pulse to the excited nuclei to cause the coherence transformation.

7. A method according to claim 6 wherein step A comprises the step of:
   A1. applying a $\pi/2$ RF pulse to the NMR-active nuclei.

8. A method according to claim 6 further comprising the steps of:
   C. detecting an NMR signal generated by the NMR-active nuclei with a receiver coil that has a radial phase.

9. A method according to claim 8 wherein the RF magnetic field pulse applied to the excited NMR nuclei in step A comprises a magnetic field having a phase which has a spatial dependence relative to the receiver coil phase such that all possible phase differences are equally represented throughout the sample.

10. A method according to claim 8 wherein step B comprises the step of:
   B1. using an RF coil to generate the magnetic field gradient pulse and step C comprises the step of:
   C1. detecting the NMR signal with the RF coil used in step A1.

11. A method for improving selectivity of an NMR COSY experiment involving NMR-active nuclei in a sample, the method comprising the steps of:
   A. exciting the NMR-active nuclei with a homogeneous RF pulse to generate a spin coherence;
   B. allowing the spin coherence generated in step A to evolve for a predetermined time period;
   C. applying an RF magnetic field mixing pulse to the excited NMR nuclei, the RF magnetic field mixing pulse comprising a magnetic field having a uniform RF field strength throughout the sample, but a phase which has a spatial dependence such that all possible phases are equally represented throughout the sample;
   D. detecting an NMR signal with a homogeneous receiver coil;
   E. increasing the predetermined time interval in step B;
   F. repeating steps A-D a predetermined number of times to generate NMR data; and
   G. performing a two-dimensional Fourier transformation on the NMR data obtained in step F.

12. A method according to claim 11 wherein step C comprises the steps of:
   C1. applying a second homogeneous RF pulse to the excited nuclei; and
   C2. applying the RF magnetic field mixing pulse to the excited NMR nuclei.

13. A method according to claim 12 wherein the RF magnetic field mixing pulse applied in step C2 is a $\pi$ pulse.

14. A method for improving selectivity of an NMR COSY experiment involving NMR-active nuclei in a sample, the method comprising the steps of:
   A. exciting the NMR-active nuclei to generate a spin coherence with an RF magnetic field pulse comprising a magnetic field having a uniform RF field strength throughout the sample, but a phase which has a spatial dependence such that all possible phases are equally represented throughout the sample;
   B. allowing the spin coherence generated in step A to evolve for a predetermined time period;
   C. applying a homogeneous RF mixing pulse to the excited NMR nuclei;
   D. detecting an NMR signal with a radial receiver coil;
   E. increasing the predetermined time interval in step B;
   F. repeating steps A-D a predetermined number of times to generate NMR data; and
   G. performing a two-dimensional Fourier transformation on the NMR data obtained in step F.

15. A method according to claim 14 wherein step C comprises the steps of:
   C1. applying a second radial RF pulse to the excited nuclei; and
   C2. applying the RF magnetic field mixing pulse to the excited NMR nuclei.

16. A method according to claim 15 wherein the RF magnetic field mixing pulse applied in step C2 is a $\pi$ pulse.

17. A method for improving selectivity of NMR experiments involving NMR-active nuclei in a sample and a series of coherence transformations, the method comprising the steps of:
   A. exciting the NMR-active nuclei with a homogeneous RF pulse to generate a spin coherence; and
   B. applying a sequence of RF magnetic field pulses to the excited NMR nuclei to cause the series of coherence transformation, at least one of the RF magnetic field pulses comprising a magnetic field having a uniform RF field strength throughout the sample, but a phase which has a spatial dependence such that all possible phases are equally represented throughout the sample.

18. A method for improving selectivity of NMR experiments involving NMR-active nuclei in a sample and a series of coherence transformations, the method comprising the steps of:
   A. exciting the NMR-active nuclei to generate a spin coherence with an RF magnetic field pulse comprising a magnetic field having a uniform RF field strength throughout the sample, but a phase which has a spatial dependence such that all possible phases are equally represented throughout the sample; and
   B. applying a series of RF pulses to the excited nuclei to cause the series of coherence transformations, at least one of the RF pulses being a homogeneous pulse.

* * * * *